(12) United States Patent
Collins, III et al.

(10) Patent No.: US 11,523,083 B2
(45) Date of Patent: Dec. 6, 2022

(54) LOW POWER IN-PIXEL SINGLE SLOPE ANALOG TO DIGITAL CONVERTER (ADC)

(71) Applicant: BAE SYSTEMS Information and Electronic Systems Integration Inc., Nashua, NH (US)

(72) Inventors: Thomas E. Collins, III, Tyngsboro, MA (US); Dimitre P Dimitrov, Wayland, MA (US); Allen W. Hairston, Andover, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 353 days.

(21) Appl. No.: 16/787,741

(22) Filed: Feb. 11, 2020

(65) Prior Publication Data
US 2021/0250536 A1    Aug. 12, 2021

(51) Int. Cl.
*H04N 5/378*    (2011.01)
*H04N 5/376*    (2011.01)
*H03M 1/56*    (2006.01)
*H03M 1/34*    (2006.01)

(52) U.S. Cl.
CPC ............ *H04N 5/378* (2013.01); *H03M 1/34* (2013.01); *H03M 1/56* (2013.01); *H04N 5/3765* (2013.01)

(58) Field of Classification Search
CPC combination set(s) only.
See application file for complete search history.

(56) References Cited

U.S. PATENT DOCUMENTS

2019/0356875 A1* 11/2019 Hairston .................. G01J 5/24

* cited by examiner

*Primary Examiner* — Twyler L Haskins
*Assistant Examiner* — Fayez A Bhuiyan
(74) *Attorney, Agent, or Firm* — Maine Cernota & Rardin; Gary McFaline

(57) ABSTRACT

Techniques, systems, architectures, and methods for reducing peak power during an Analog-to-Digital Conversion (ADC) process, in embodiments on a Focal Plane Array (FPA).

17 Claims, 4 Drawing Sheets

US 11,523,083 B2

LOW POWER IN-PIXEL SINGLE SLOPE ANALOG TO DIGITAL CONVERTER (ADC)

STATEMENT OF GOVERNMENT INTEREST

This invention was made with government support under Contract No. SCEC-PLA-0002 awarded by the U.S. Army. The United States Government has certain rights in the inventions.

FIELD OF THE DISCLOSURE

The following disclosure relates generally to imaging devices and, more specifically, to pixel design and mode of operation.

BACKGROUND

Digital detection of images is a very widely used technology, having applications ranging from consumer-oriented cameras and video apparatuses to law enforcement and military equipment. For virtually all of these applications, there is a growing demand for higher image pixel counts, higher pixel density, increased sensitivity, improved dynamic range, lower power consumption, faster image processing, and the ability to switch between modes offering different balances of these characteristics, dependent on the requirements present at a given time.

At the heart of all digital imaging systems, which may be referred to generally as Solid State Area Array Imaging Devices (SSAAIDs), is the Focal Plane Array ("FPA"), which is a two-dimensional array of elements upon which an image is focused, whereby each of the FPA elements or "pixels" develops an analog output "signal charge" that is proportional to the intensity of the electromagnetic radiation that is impinging on it after a given interval of time. This signal charge can then be stored (integrated), measured (counted), and used to produce an image.

The storage and measurement of the electromagnetic radiation that has impinged on a pixel over a given amount of time is typically accomplished using a Read-Out Integrated Circuit (ROIC). In some ROICs, the signal charge is integrated in the pixel, typically onto a capacitor, and then the analog voltage representing the integrated signal is readout out of the array. The signal can then be sent off the ROIC, in the case of all analog ROICs, or can be converted to a digital signal by Analog-to-Digital Converting (ADC) circuitry. Digital pixel Read-Out Integrated Circuits (DROICs), such as that shown in FIG. 1, both integrate and convert (ADC) the signal charge inside each pixel. This simultaneous conversion of every pixel results in very high current requirements at the start of the Analog-to-Digital Conversion (ADC) process, which may also be herein referred to simply as conversion, that taper down to no current flow as conversion completes, as shown in FIG. 2A. The aforementioned high current requirement limits at least the achievable pixel count, pixel density, sensitivity, dynamic range, and conversion speed of the imaging device.

What is needed, therefore, are systems and methods to reduce the peak power required for a pixel-array during the analog to digital conversion process.

SUMMARY

An example embodiment of the present disclosure provides a system including a plurality of pixels, each pixel being configured to conduct an Analog-to-Digital Conversion (ADC) of image data wherein only half of the pixels count at any one time. In embodiments, this is accomplished by having half of the pixels count until a ramp is equal to an input signal and then having the remaining pixels count the time from when the ramp is equal to the input signal until the end of conversion. Having only roughly half of the pixels being counted at any given time results in significantly lower peak current while also keeping current relatively constant during counting.

Implementations of the techniques discussed above may include a method or process, a system or apparatus, a kit, or a computer software stored on a computer-accessible medium. The details or one or more implementations are set forth in the accompanying drawings and the description below. Other features will be apparent from the description and drawings, and form the claims.

The features and advantages described herein are not all-inclusive and, in particular, many additional features and advantages will be apparent to one of ordinary skill in the art in view of the drawings, specification, and claims. Moreover, it should be noted that the language used in the specification has been selected principally for readability and instructional purposes and not to limit the scope of the inventive subject matter.

These and other features of the present embodiments will be understood better by reading the following detailed description, taken together with the figures herein described. The accompanying drawings are not intended to be drawn to scale. For purposes of clarity, not every component may be labeled in every drawing.

DETAILED DESCRIPTION

Figure 1:
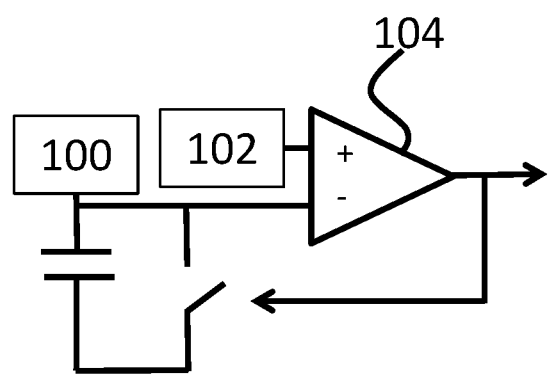
FIG. 1 is a block diagram illustrating a prior art readout integrated circuit.

FIG. 1 shows a prior art readout integrated circuit. The readout integrated circuit comprises a comparator 104 having a voltage input 100 and voltage reference 102 (the voltage reference 102 is also herein referred to as a voltage ramp 102) as inputs, among other enabling circuitry (e.g. integration capacitor(s) and transistors).

For background, a comparator compares two voltages and outputs either a high or low voltage, depending on inputs. Comparators are often used, for example, to check whether an input has reached some predetermined value. In most cases a comparator is implemented using a dedicated comparator IC, but op-amps may be used as an alternative. Comparator diagrams and op-amp diagrams generally use the same symbols and references made to one or the other herein should be understood to allow the use of either.

Comparator circuits amplify the voltage difference between the voltage input 100 (i.e. the signal) and voltage reference 102 and outputs the result. If voltage input 100 is greater than voltage reference 102, then the output voltage will rise to its positive saturation level; that is, to the voltage at the positive side. If voltage input 100 is lower than voltage reference 102, then the output voltage will fall to its negative saturation level, equal to the voltage at the negative side. These outputs may also be thought of as a high voltage and a low voltage, respectively.

Figure 2A:
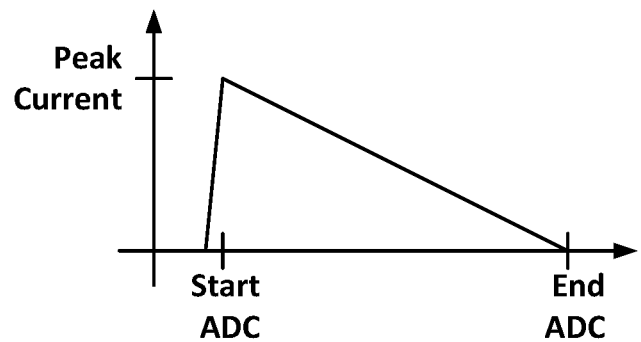
FIG. 2A is a chart comparing current to the progress of analog-to-digital conversion in accordance with prior art systems and methods.
Figure 2B:
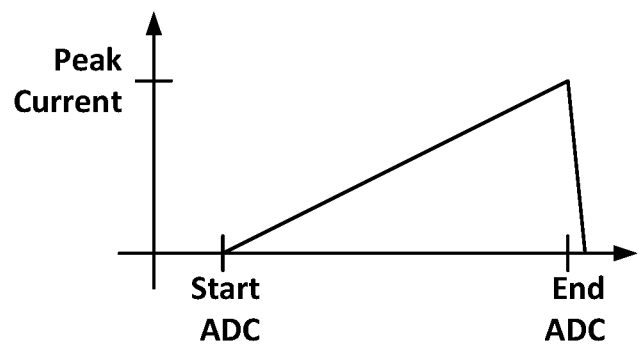
FIG. 2B is a chart comparing current to the progress of analog-to-digital conversion in accordance with prior art systems and methods.
Figure 2C:
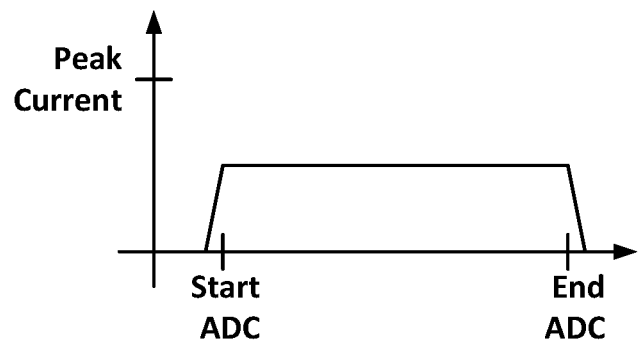
FIG. 2C is a chart comparing current to the progress of analog-to-digital conversion in accordance with embodiments of the present disclosure.

The behavior of the prior art ROIC shown in FIG. 1 is described in FIGS. 2A and 2B. More specifically, in some prior art Focal Plane Arrays (FPAs), the pixels that make up the FPA count until a pulse is received, peak current occurs in the beginning of the Analog-To-Digital Conversion (ADC) process (i.e. conversion) and starts decreasing as pixels stop counting because they have fired, as described by FIG. 2A. If, however, all pixels start counting on pulse, peak current occurs in the end of ADC conversion, as described by FIG. 2B.

In contrast, embodiments of the present disclosure are configured such that some of the pixels in the FPA count from the beginning of the ADC process until the voltage reference or ramp 102 is equal to the voltage input or signal 100 and other pixels count from when the voltage reference or ramp 102 equals the voltage input or signal 100 until the end of the ADC process. This configuration allows current consumption to remain more constant, relative to the aforementioned prior art configurations, through ADC conversion, resulting in lower peak current. Lower peak current allows for increased performance by providing headroom for additional current using the same hardware. Alternatively, current-carrying conductors and devices could be made smaller and potentially more efficient.

In embodiments, ADC is performed on charge accumulated, in embodiments from a photodetector, on an input node, which may be a capacitor, during an integration period, resulting in a voltage proportional to the strength of the charge over the integration period being induced on the input node.

In embodiments, half of the pixels in the FPA count from the beginning of the Analog-To-Digital Conversion (ADC) process until the voltage reference or ramp 102 equals the voltage input 100 and the remaining half of the pixels count from when the voltage reference or ramp 102 equals the voltage input 100 until the end of conversion.

In embodiments, a synchronous clock 302 and ramp 102 are distributed across the FPA.

In embodiments, each pixel is configured to perform in-pixel, single-slope ADC using a comparator and clock located in that pixel.

Figure 3A:
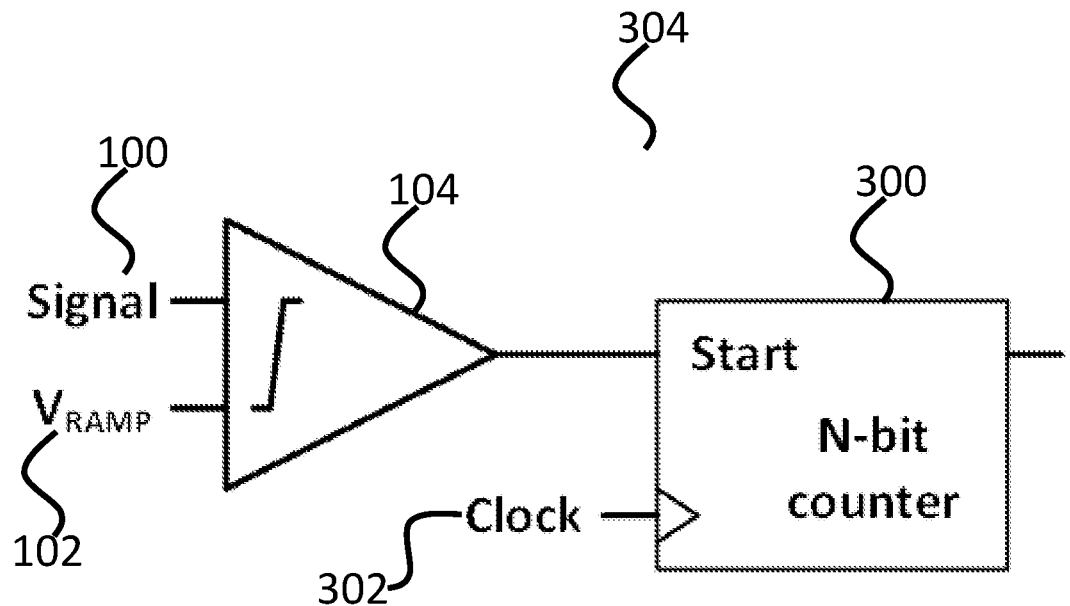
FIG. 3A is a schematic showing a portion of a pixel circuit that enables the analog-to-digital conversion method described in the chart shown in FIG. 1C, in accordance with embodiments of the present disclosure.
Figure 3B:
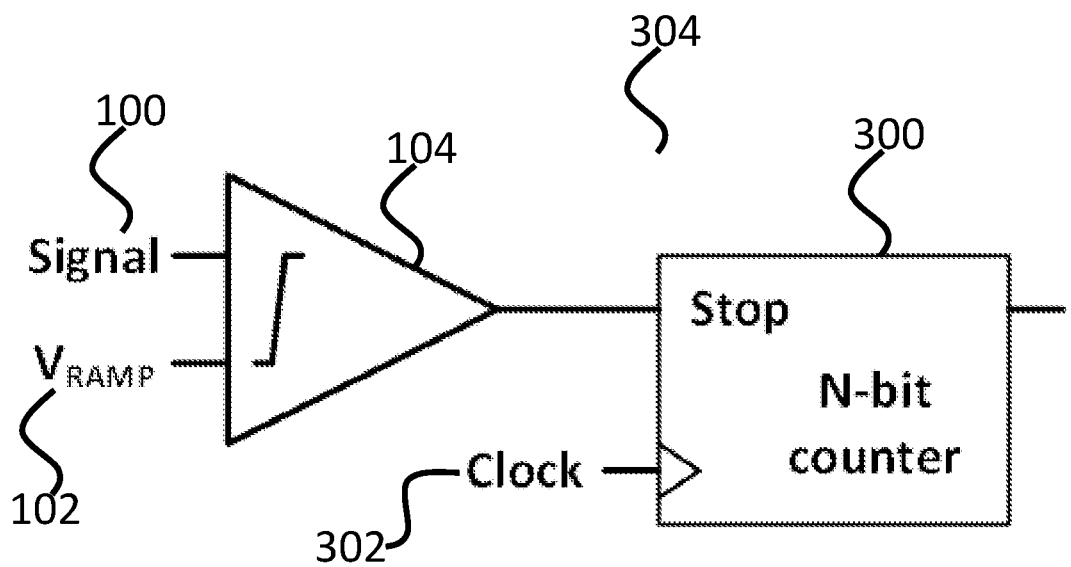
FIG. 3B is a schematic showing a portion of a pixel circuit that enables the analog-to-digital conversion method described in the chart shown in FIG. 1C, in accordance with embodiments of the present disclosure.

In embodiments, such as those shown in FIGS. 3A and 3B, each pixel includes a comparator 104 and counter 300, the comparator 104 being configured to compare the signal 100 to the voltage reference or ramp 102 and to output a high or a low signal to the counter 300 depending on which of the signal 100 or voltage reference or ramp 102 is of a higher voltage. This combination of elements and the circuit created thereby may be generally referred to as an Analog-to-Digital conversion unit 304.

In the embodiment shown in FIG. 3A, the counter 300 counts the number of clock cycles from when the voltage reference or ramp 102 equals the signal 100 to the end of the ADC process. In contrast, in the embodiment shown in FIG. 3B, the counter 300 counts the number of clock cycles until the voltage reference or ramp 102 equals the signal 100.

Figure 4:
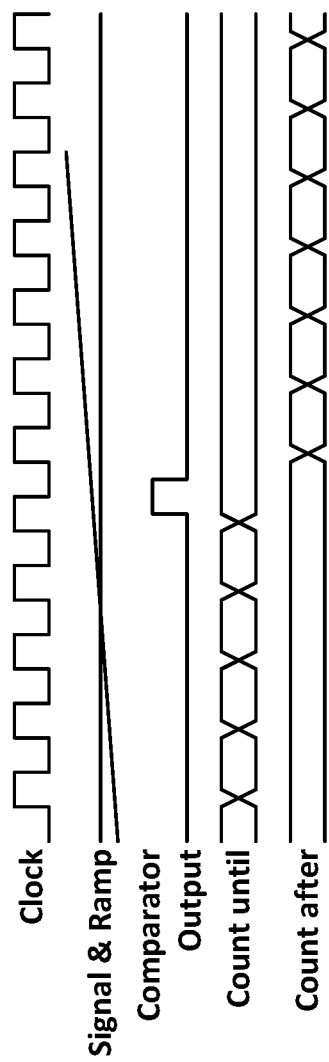
FIG. 4 is a chart comparing the clock, signal & ramp, comparator output, and counter operation of a pixel in accordance with embodiments of the present disclosure.

This behavior is more fully described in FIG. 4, which is a chart comparing the clock 302, signal 100, ramp 102, comparator 104 output, and counter 300 operation of a pixel in accordance with embodiments of the present disclosure. As can be seen in FIG. 4, the clock 302 rate stays constant, with each clock 302 cycle incrementing the counter 300 by its Least Significant Bit (LSB) while that counter 300 is active. FIG. 4 also shows the voltage reference 102 or ramp 102 as increasing over time and the signal 100 as being substantially constant, which is due to integration being stopped, in embodiments, during ADC. Comparator 104 output is shown as being enabled shortly following the signal 100 becoming equal to the voltage reference or ramp 102. Lastly, a first group of counters 300, which are configured to count until the signal 100 becomes equal to the voltage reference 102 or ramp 102, are shown as incrementing once per clock 302 cycle until the signal 100 becomes equal to the voltage reference 102 or ramp 102, at which time those counters 300 cease incrementing and a second group of counters 300, which are configured to count after the signal 100 becomes equal to the voltage reference or ramp 102 until the end of conversion, begin incrementing once per clock 302 cycle. In embodiments, the ramp 102 changes (ramps) are synchronized to the clock 302 and therefore each pixel counter 300.

The foregoing description of the embodiments of the present disclosure has been presented for the purposes of illustration and description. It is not intended to be exhaustive or to limit the present disclosure to the precise form disclosed. Many modifications and variations are possible in light of this disclosure. It is intended that the scope of the present disclosure be limited not by this detailed description, but rather by the claims appended hereto.

A number of implementations have been described. Nevertheless, it will be understood that various modifications may be made without departing from the scope of the disclosure. Although operations are depicted in the drawings in a particular order, this should not be understood as requiring that such operations be performed in the particular order shown or in sequential order, or that all illustrated operations be performed, to achieve desirable results.

What is claimed is:

1. A focal plane array, the focal plane array comprising:
   a plurality of pixels, each pixel comprising:
      at least one detector configured to generate an electrical current in response to electromagnetic radiation impinging thereon; and
      a clock;
   at least one readout integrated circuit in operative communication with at least one of the plurality of pixels, said readout integrated circuit being configured to perform an analog to digital conversion on current generated by the at least one detector over a fixed period of time,
   wherein the plurality of pixels are grouped into at least two groups, a first group of pixels and a second group of pixels;
   wherein the at least one readout integrated circuit is further configured to begin converting the electrical current generated by the detectors in the first group of pixels to a digital value at the start of the analog to digital conversion process and to begin converting the electrical current generated by the detectors in the second group of pixels to a digital value at a later time during the analog to digital conversion process.

2. The focal plane array of claim 1, wherein the first group of pixels consists of half of the plurality of pixels and the second group of pixels consists of half of the plurality of pixels.

3. The focal plane array of claim 1, wherein the first and second groups of pixels comprise equal numbers of pixels.

4. The focal plane array of claim 1, wherein each pixel comprises a readout integrated circuit.

5. The focal plane array of claim 4, wherein each readout integrated circuit comprises a comparator and a counter, the counter being in communication with the clock.

6. The focal plane array of claim 5, wherein the comparator comprises at least two inputs and one output, the inputs being a voltage input corresponding to a signal proportional to the current that impinged upon the detector during a preceding integration period and a voltage reference or ramp and the output being a value between the voltage of the voltage input and the voltage of the voltage reference or ramp.

7. The focal plane array of claim 6, wherein the counters of pixels belonging to the first group of pixels are configured to begin counting at the start of the analog to digital conversion process and stop counting when the voltage input is equal to the voltage reference and wherein the counters of pixels belonging to the second group of pixels are configured to begin counting when the voltage input is equal to the voltage reference until the analog to digital conversion process is complete.

8. The focal plane array of claim 7 wherein said counters are configured to count clock cycles.

9. The focal plane array of claim 8 wherein the clock and voltage reference are distributed across the focal plane array.

10. The focal plane array of claim 8 wherein the clock is a synchronous clock.

11. The focal plane array of claim 1 wherein each pixel is configured to perform in-pixel, single-slope analog-to-digital conversion using the comparator and the clock located in the pixel.

12. The focal plane array of claim 5 wherein said counter, upon activation and until deactivation, is configured to count clock cycles.

13. A focal plane array, the focal plane array comprising:
a plurality of pixels, wherein each pixel is configured to perform in-pixel, single-slope analog-to-digital conversion using the comparator and the clock located in the pixel, each pixel comprising:
at least one detector configured to generate an electrical current in response to electromagnetic radiation impinging thereon;
a voltage reference;
a comparator in electrical communication with the voltage reference and a voltage signal configured to provide a voltage proportional to the current generated by the at least one detector;
a counter in electrical communication with the comparator; and
a clock in electrical communication with said counter,
wherein the plurality of pixels are grouped into at least two groups, a first group of pixels and a second group of pixels;
wherein the counters of pixels belonging to the first group of pixels are configured to begin counting at the start of an analog-to-digital conversion process and stop counting when the voltage signal is equal to the voltage reference, and
wherein the counters of pixels belonging to the second group of pixels are configured to begin counting when the voltage input is equal to the voltage reference until the analog to digital conversion process is complete.

14. The focal plane array of claim 13 wherein said counters are configured to count clock cycles.

15. An analog to digital conversion system, the system comprising:
a plurality of analog to digital conversion units, each analog to digital conversion unit comprising:
a comparator having a signal and a voltage reference as inputs;
a clock; and
a counter in communication with an output of the comparator and in further communication with each clock in the plurality of analog to digital conversion units,
wherein the plurality of analog to digital conversion units are grouped into at least two groups, a first group of analog to digital conversion units and a second group of analog to digital conversion units,
wherein the first group of analog to digital conversion units is configured to begin an analog to digital conversion process on the signal when the comparator output is high and to stop the analog to digital conversion process when the comparator output is low, and
the second group of analog to digital conversion units is configured to begin an analog to digital conversion process on the signal when the comparator output is low and to stop the analog to digital conversion process when the comparator output is high.

16. The analog to digital conversion system of claim 15 wherein said counters are configured to count clock cycles.

17. The analog to digital conversion system of claim 15 wherein the clock and voltage reference are distributed across the analog to digital conversion system.

* * * * *